US008248165B2

(12) United States Patent
Umeda

(10) Patent No.: US 8,248,165 B2
(45) Date of Patent: Aug. 21, 2012

(54) AMPLIFIER AND OPTICAL MODULE PERFORMING GAIN CONTROL

(75) Inventor: Daisuke Umeda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/999,010

(22) PCT Filed: Nov. 12, 2008

(86) PCT No.: PCT/JP2008/070594

§ 371 (c)(1), (2), (4) Date: Dec. 14, 2010

(87) PCT Pub. No.: WO2009/153892

PCT Pub. Date: Dec. 23, 2009

(65) Prior Publication Data

US 2011/0129224 A1 Jun. 2, 2011

(30) Foreign Application Priority Data

Jun. 17, 2008 (JP) ................................ 2008-158289

(51) Int. Cl.
*H03F 3/08* (2006.01)

(52) U.S. Cl. ................................ 330/308; 250/214 AG

(58) Field of Classification Search .................. 330/308; 250/214 AG

See application file for complete search history.

(56) References Cited

U.S. PATENT DOCUMENTS

| | | | | |
|---|---|---|---|---|
| 5,874,861 | A | 2/1999 | Nagase et al. | |
| 7,042,295 | B2 * | 5/2006 | Guckenberger et al. ...... | 330/308 |
| 7,420,419 | B2 * | 9/2008 | Hori ............................ | 330/288 |

FOREIGN PATENT DOCUMENTS

| | | |
|---|---|---|
| JP | 63-151205 | 6/1988 |
| JP | 9-8563 | 1/1997 |
| JP | 9-186659 | 7/1997 |
| JP | 2000-305644 | 11/2000 |
| JP | 2006-101223 | 4/2006 |
| JP | 2006-203487 | 8/2006 |
| JP | 2007-005901 | 1/2007 |
| JP | 2008-118497 | 5/2008 |

OTHER PUBLICATIONS

Japanese Notice of Grounds of Rejection, w/ English translation thereof, issued in Japanese Patent Application No. 2008-158289, dated Dec. 27, 2011.

* cited by examiner

*Primary Examiner* — Steven J Mottola

(74) *Attorney, Agent, or Firm* — McDermott Will & Emery LLP

(57) ABSTRACT

An amplifier includes a first transistor having a first conducting electrode receiving a current, a control electrode coupled to the first conducting electrode, and a second conducting electrode coupled to a fixed voltage source; a second transistor having a first conducting electrode, a second conducting electrode and a control electrode coupled to the control electrode of the first transistor; a feedback resistance coupled to the control electrode of the second transistor for feeding back an output of the second transistor to the control electrode of the second transistor; and a variable resistance element for controlling a ratio between a current flowing from the first conducting electrode of the first transistor into the control electrode of the second transistor and the feedback resistance and a current flowing from the first conducting electrode into the second conducting electrode in the first transistor.

11 Claims, 12 Drawing Sheets

PREMISES DEVICE
OPTF
402
301
51
53
MULTIPLEXER/ DEMULTIPLEXER
201
LENS
PD
LIGHT RECEIVING ELEMENT
101
PREAMPLIFIER
52
202
LENS
203
LIGHT EMITTING ELEMENT
T1
T2
T3
302
54
POSTAMPLIFIER
55
CLOCK/DATA RECOVERY UNIT
RST
303
PON TRANSMISSION UNIT
304
COMMUNICATION CONTROL UNIT
305
UPPER NETWORK RECEPTION UNIT
306
UPPER NETWORK TRANSMISSION UNIT
502
UPPER NETWORK

VOUT
4
3
DIFFERENTIAL CONVERSION CIRCUIT
RST
101
2
1
GAIN CONTROL CIRCUIT
NF
VAMP
IS1
PS3
$R_F$
$R_L$
N0
$i_{in}$
C1
PS1
$i_{pd}$
PS2
PD
N1
$i_{bps}$
M1
M11
PS4
INV
GSW VOUT
4
3
DIFFERENTIAL CONVERSION CIRCUIT
RST
103
1
GAIN CONTROL CIRCUIT
2
NF
VAMP
IS1
PS3
$R_L$
$R_F$
N0
GSW
$i_{in}$
M1
INV
M11
$i_{pd}$
PS1
PD
N1
$i_{bps}$
PS2

VOUT
4
3
DIFFERENTIAL CONVERSION CIRCUIT
RST
104
2
1
GAIN CONTROL CIRCUIT
NF
VAMP
IS1
PS3
$R_L$
N0
$R_F$
$i_{in}$
C1
PS1
$i_{pd}$
PD
N1
$i_{bps}$
M1
PS2
$I_{dc}$
PS5
M11
PS4
IS2
INV
GSW VOUT
4
3
DIFFERENTIAL CONVERSION CIRCUIT
106
2
12
GAIN CONTROL CIRCUIT
VAMP
IS1
NF
PS3
$R_L$
$R_F$
N0
$i_{in}$
C1
PS1
PD
$i_{pd}$
N1
$i_{bps}$
M1
PS2
GCNT

AMPLIFIER AND OPTICAL MODULE PERFORMING GAIN CONTROL

RELATED APPLICATIONS

This application is the U.S. National Phase under 35 U.S.C. §371 of International Application No. PCT/JP2008/070594, filed on Nov. 12, 2008, which in turn claims the benefit of Japanese Application No. 2008-158289, filed on Jun. 17, 2008, the disclosures of which Applications are incorporated by reference herein.

TECHNICAL FIELD

The present invention relates to an amplifier and an optical module, and particularly to an amplifier and an optical module performing gain control.

BACKGROUND ART

In the GE-PON (Gigabit Ethernet (registered trademark) Passive Optical Network) achieving a communication speed of 1 gigabit/second through the public communication line network using an optical fiber, a light receiving element detects a light signal from a premises device, and a TIA (trans-impedance amplifier), that is, a preamplifier for amplifying the detection current output from this light receiving element is provided in a station side device.

For example, Japanese Patent Laying-Open No. 63-151205 (Patent Document 1) discloses the following configuration as a conventional preamplifier, in which a light receiving circuit outputs, through a preamplifier, the output current of an avalanche photodiode as an output voltage that varies depending on the light input and controls this output voltage by an AGC (Automatic Gain Control) circuit. The light receiving circuit includes a saturation voltage detection circuit for detecting saturation of the output voltage of the preamplifier, and a diversion circuit for diverting the output current of the avalanche photodiode in response to the output of the saturation voltage detection circuit.

Furthermore, Japanese Patent Laying-Open No. 09-008563 (Patent Document 2) discloses the configuration having a light receiving preamplifier for amplifying a current signal from a light receiving element. The light receiving preamplifier includes a feedback amplifier circuit configured to vary the gain phase characteristics by the first control signal in accordance with the magnitude of the current signal; and a large input control circuit configured to compare the output of the feedback amplifier circuit with the reference voltage to output the first control signal to the feedback amplifier circuit. The feedback amplifier circuit consists of an amplifier for amplifying the current signal, a buffer circuit for buffering the output of the amplifier, the first and second feedback resistances for switching the gain of the amplifier, a phase compensation capacitor for performing phase compensation of the amplifier, and the first and second switch elements for performing the switching operation for the gain and phase compensation.

Furthermore, Japanese Patent Laying-Open No. 2006-101223 (Patent Document 3) discloses the configuration including an inverting amplifier circuit to which a burst signal is input; the first feedback circuit disposed between the input node and the output node of the inverting amplifier circuit; the second feedback circuit disposed in parallel with the first feedback circuit; a burst section determination unit for determining the duration period of the burst signal, based on the output of the inverting amplifier circuit, and outputting the first signal indicative of an off period of the burst signal; and a gain switching signal generation unit for determining the amplitude of the burst signal, based on the output of the inverting amplifier circuit, and outputting the second signal indicating that the amplitude has exceeded a predetermined threshold value. The second feedback circuit includes a phase compensation capacitor and a switch that is controlled to be opened and closed based on the first and second signals, in which the gain is controlled by opening and closing the switch.

Patent Document 1: Japanese Patent Laying-Open No. 63-151205

Patent Document 2: Japanese Patent Laying-Open No. 09-008563

Patent Document 3: Japanese Patent Laying-Open No. 2006-101223

DISCLOSURE OF THE INVENTION

Problems to be Solved by the Invention

The preamplifier disclosed in Patent Document 1 is configured such that saturation of the output voltage is detected by a saturation voltage detection circuit and the output current of the avalanche photodiode is diverted in accordance with the output of the saturation voltage detection circuit, thereby decreasing the current from the avalanche photodiode to a preamplifier (amplifier circuit) by a predetermined amount. However, this configuration makes it difficult to adjust the amount of diversion of the current. In other words, when the amount of diversion is set too small, saturation of the preamplifier cannot be prevented in the case where the level of the light input signal is relatively high, which causes a problem that the dynamic range of the preamplifier becomes narrow. On the other hand, the amount of diversion is set too large, which also causes a problem that an S/N (Signal to Noise) ratio is deteriorated.

In the embodiment of Patent Document 1, the output voltage of the preamplifier performing inverting amplification is compared with a reference voltage Vref. When the level of the input current signal to the preamplifier is high, the output voltage of the preamplifier falls below reference voltage Vref, and the output current of the avalanche photodiode is diverted. It is difficult to set reference voltage Vref. When reference voltage Vref is set too low, the amount of diversion is decreased, with the result that the dynamic range of the preamplifier becomes narrow. Meanwhile, the output current of the avalanche photodiode is diverted only in the section in which the input current signal to the preamplifier is at a logic high level. Accordingly, when reference voltage Vref is set too high, the amount of diversion is increased, leading to deterioration of the S/N ratio.

FIG. 13 is a diagram schematically showing the configuration of the preamplifier disclosed in Patent Documents 2 and 3.

Referring to FIG. 13, the preamplifier disclosed in Patent Documents 2 and 3 is configured to change the gain by switching the resistance value of a feedback resistance RF.

Assuming that the gain of an amplifier circuit 51 is A, the resistance value of feedback resistance RF is RF and the input capacitance such as a parasitic capacitance of a light receiving element PD is Cin, a DC gain ZT and −3 dB band f−3 dB of this preamplifier are represented by the following equation.

$$Z_T = \frac{A}{1+A} \times R_F \quad \text{[Equation 1]}$$

$$f_{-3dB} = \frac{A}{2 \times \pi \times R_F \times C_{in}}$$

In the above equations, the frequency characteristic of amplifier circuit 51 are ignored for the sake of simplicity of explanation, in which gain A is assumed as a fixed value. However, when the bandwidth of amplifier circuit 51 is narrower than the bandwidth of the feedback loop formed by feedback resistance RF, the phase margin is decreased to cause instability of the feedback loop. In this case, when amplifier circuit 51 has primary characteristics (A(s)=A/(1+s)), amplifier circuit 51 is required to have a bandwidth of approximately √2 time of the feedback loop. In order to design the preamplifier having a high gain and a wide bandwidth, gain A of amplifier circuit 51 should be increased within the range in which the phase margin is satisfied.

In the preamplifier shown in FIG. 13, when the feedback resistance value is switched so as to be decreased in the case where the light input signal level is high, DC gain ZT is decreased and the bandwidth of the feedback loop is widened. This leads to a shortage of the bandwidth of amplifier circuit 51, which causes a decrease in the phase margin.

In order to solve the above-described problems, a relatively large phase margin should be ensured in advance, that is, amplifier circuit 51 should be designed to have a relatively wide bandwidth. However, this method is not suitable for the high-frequency preamplifier since the (gain×bandwidth) of the transistor is constant, and thus, the gain is decreased in proportion to an increase in the width of the bandwidth.

Furthermore, in the method for preventing an increase in width of the bandwidth of the feedback loop by controlling the bandwidth by the phase compensation capacitor as in the preamplifier disclosed in Patent Document 2, parameter adjustment is difficult, and furthermore, influences of manufacturing variations and temperature fluctuations are more likely to be exerted.

Accordingly, an object of the present invention is to provide an amplifier and an optical module capable of extending a dynamic range and amplifying a wideband signal with stability.

Means for Solving the Problems

An amplifier according to an aspect of the present invention includes a first transistor having a first conducting electrode receiving a current, a control electrode coupled to the first conducting electrode, and a second conducting electrode coupled to a fixed voltage source; a second transistor having a first conducting electrode, a second conducting electrode coupled to the fixed voltage source, and a control electrode coupled to the control electrode of the first transistor; a feedback resistance coupled to the control electrode of the second transistor for feeding back an output of the second transistor to the control electrode of the second transistor; and a variable resistance element for controlling a ratio between a current flowing from the first conducting electrode of the first transistor into the control electrode of the second transistor and the feedback resistance, and a current flowing from the first conducting electrode into the second conducting electrode in the first transistor.

Preferably, the variable resistance element is connected between the second conducting electrode of the first transistor and the fixed voltage source.

More preferably, the variable resistance element is a third transistor having a first conducting electrode coupled to the second conducting electrode of the first transistor and a second conducting electrode coupled to the fixed voltage source. The amplifier further includes a fourth transistor having a first conducting electrode coupled to the second conducting electrode of the second transistor and a second conducting electrode coupled to the fixed voltage source.

More preferably, a ratio between a size of the first transistor and a size of the second transistor is approximately equal to a ratio between a size of the third transistor and a size of the fourth transistor.

Preferably, the variable resistance element is connected between the control electrode of the first transistor, and the first conducting electrode of the first transistor and the control electrode of the second transistor.

Preferably, the first transistor is identical in configuration to the second transistor, and the amplifier further includes a resistance coupled to the first conducting electrode of the second transistor and formed of a material identical to a material of the feedback resistance.

Preferably, the amplifier further includes a current source supplying a constant current to the first conducting electrode of the first transistor.

Preferably, the amplifier includes a plurality of sets each including the first transistor and the variable resistance element. The first conducting electrode and the control electrode of each first transistor are commonly coupled to the control electrode of the second transistor.

Preferably, the amplifier further includes a control circuit for controlling a resistance value of the variable resistance element in three or more stages based on the output of the second transistor.

Preferably, the first conducting electrode of the first transistor receives a current from a light receiving element used in a passive optical network.

An optical module according to one aspect of the present invention is used in a passive optical network having an optical fiber. The optical module includes a light receiving element optically coupled to the optical fiber; a first transistor having a first conducting electrode coupled to the light receiving element, a control electrode coupled to the first conducting electrode, and a second conducting electrode coupled to a fixed voltage source; a second transistor having a first conducting electrode, a second conducting electrode coupled to the fixed voltage source, and a control electrode coupled to the control electrode of the first transistor; a feedback resistance coupled to the control electrode of the second transistor for feeding back an output of the second transistor to the control electrode of the second transistor; a variable resistance element for controlling a ratio between a current flowing from the first conducting electrode of the first transistor into the control electrode of the second transistor and the feedback resistance, and a current flowing from the first conducting electrode into the second conducting electrode in the first transistor; and a terminal receiving a control signal used for controlling a resistance value of the variable resistance element.

Effects of the Invention

The present invention allows a dynamic range to be extended to amplify a wideband signal with stability.

DESCRIPTION OF THE REFERENCE SIGNS

Figure 1:
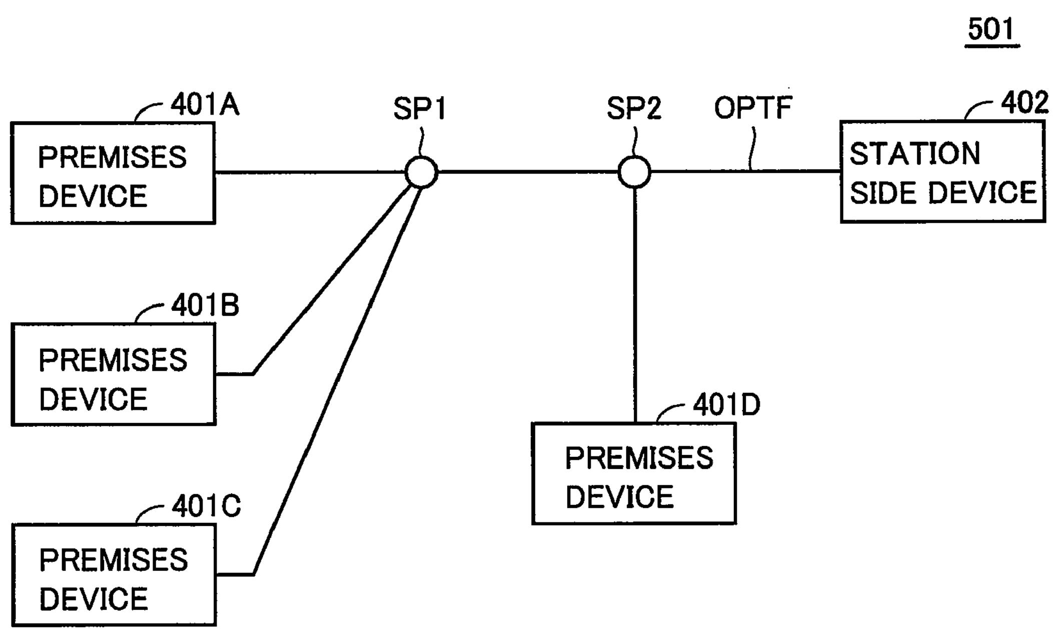
FIG. 1 is a diagram showing the configuration of an optical network according to the first embodiment of the present invention.

1, 11, 12 gain control circuit, 2 inverting amplifier circuit, 51 amplifier circuit, 3 differential conversion circuit, 4 output buffer circuit, 51 light receiving unit, 52 light transmitting unit, 53 multiplexer/demultiplexer, 54 postamplifier, 55 clock/data recovery unit, 101 to 106 preamplifier, 201 lens, 202 lens, 203 light emitting element, 301 optical module, 302 PON reception unit, 303 PON transmission unit, 304 communication control unit, 305 upper network reception unit, 306 upper network transmission unit, 401A, 401B, 401C, 401D premises device, 402 station side device, 501 optical network, 502 upper network, SP1, SP2 splitter, T1 to T3 terminal, PD light receiving element, N0, N1 to Nn, NF NPN transistor, M0, M1 to Mn, M11 N-channel MOS transistor, C0, C1 to Cn capacitor, INV inverter, RF feedback resistance, RL resistance, IS1, IS2 current source.

BEST MODES FOR CARRYING OUT THE INVENTION

The embodiments of the present invention will be hereinafter described with reference to the accompanying drawings, in which the same or corresponding components are designated by the same reference characters, and description thereof will not be repeated.

First Embodiment

FIG. 1 is a diagram showing the configuration of an optical network according to the first embodiment of the present invention.

Referring to FIG. 1, an optical network 501 is, for example, a GE-PON and includes premises devices 401A, 401B, 401C, and 401D, a station side device 402, and splitters SP1 and SP2. Premises devices 401A, 401B, 401C, 401D and station side device 402 are connected to each other via splitters SP1 and SP2 and an optical fiber OPTF, and transmit and receive a light signal to and from each other. Premises device 401D and station side device 402 are connected to each other via splitter SP2 and optical fiber OPTF, and transmit and receive a light signal to and from each other.

Figure 2:
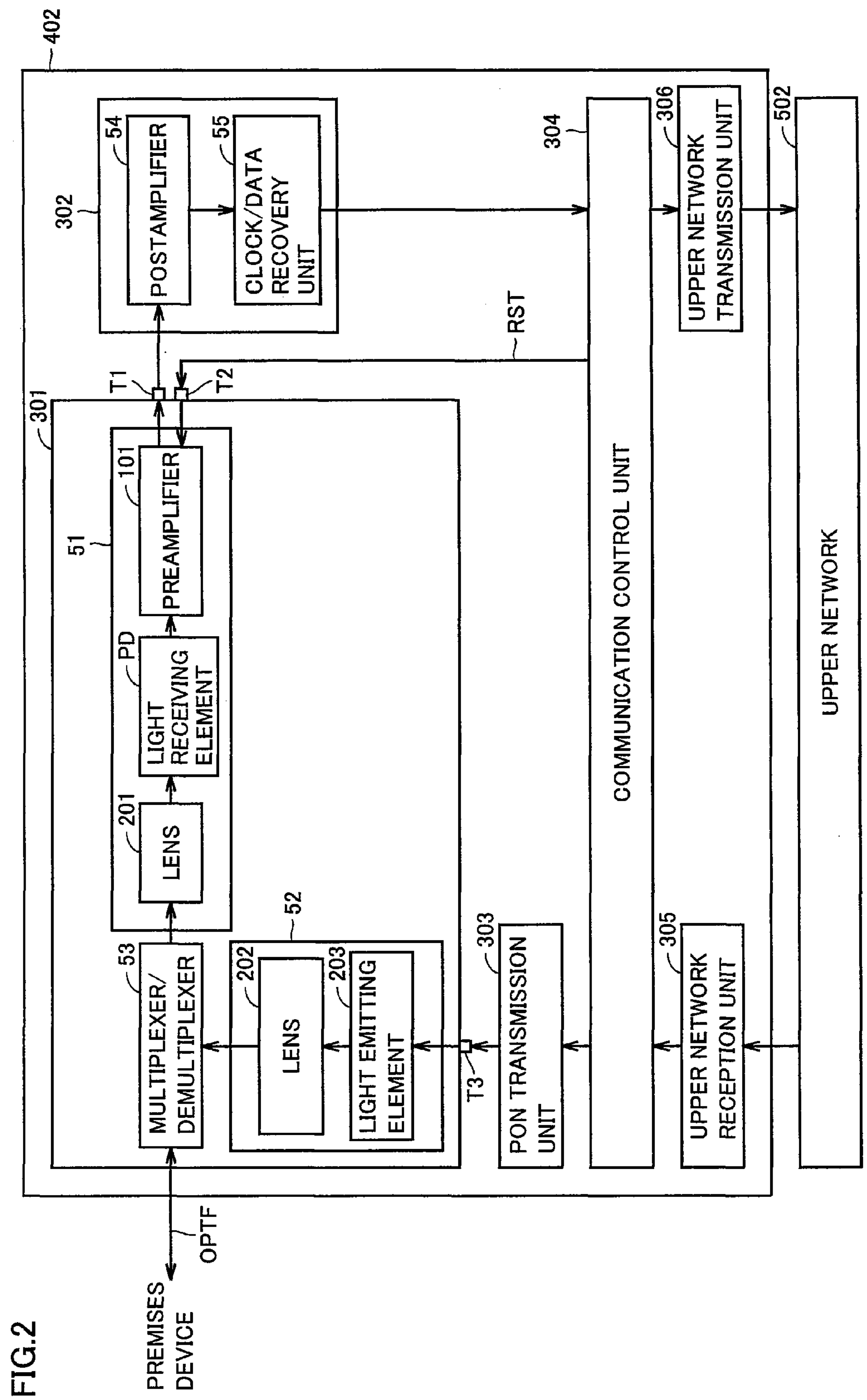
FIG. 2 is a diagram showing the configuration of the station side device according to the first embodiment of the present invention.

FIG. 2 is a diagram showing the configuration of the station side device according to the first embodiment of the present invention.

Referring to FIG. 2, station side device 402 includes an optical module 301, a PON reception unit 302, a PON transmission unit 303, a communication control unit 304, an upper network reception unit 305, and an upper network transmission unit 306. Optical module 301 includes a light receiving unit 51, a light transmitting unit 52, a multiplexer/demultiplexer 53, and terminals T1 to T3. Light receiving unit 51 includes a lens 201, a light receiving element PD and a preamplifier 101. Light transmitting unit 52 includes a lens 202 and a light emitting element 203. PON reception unit 302 includes a postamplifier 54 and a clock/data recovery unit 55.

The frame from an upper network 502 is received by upper network reception unit 305 and transmitted to communication control unit 304. Communication control unit 304 outputs the frame to terminal T3 of optical module 301 through PON transmission unit 303. In light transmitting unit 52 of optical module 301, light emitting element 203 converts the frame corresponding to an electrical signal received from PON transmission unit 303 into a light signal and then transmits the light signal to the premises device through lens 202 and multiplexer/demultiplexer 53.

Meanwhile, the light signal transmitted from the premises device to the station side device is received by light receiving unit 51 through multiplexer/demultiplexer 53. In light receiving unit 51, light receiving element PD is optically coupled to optical fiber OPTF through multiplexer/demultiplexer 53 and lens 201. Light receiving element PD outputs an electrical signal in accordance with the amount of light received from optical fiber OPTF. Preamplifier 101 amplifies the electrical signal received from light receiving element PD and outputs the same to PON reception unit 302 through terminal T1.

In PON reception unit 302, postamplifier 54 amplifies the electrical signal received from preamplifier 101 and outputs the same to clock/data recovery unit 55. Clock/data recovery unit 55 recovers a clock and data based on the electrical signal received from postamplifier 54.

Communication control unit 304 decodes the data received from clock/data recovery unit 55, and reconstructs a data frame and a control frame. Based on these reconstructed frames, communication control unit 304 transmits a frame to upper network 502 through upper network transmission unit 306. Furthermore, communication control unit 304 controls the start timing, the end timing and the like of the burst signal from the premises device so as to prevent temporal competition of the light signals transmitted from the premises devices, and then notifies the premises device of a window as a control frame indicating the period during which the burst signal can be transmitted. Since the premises device transmits a burst signal in the allocated window, communication control unit 304 outputs a reset signal RST through terminal T2 to preamplifier 101 at the start or end of the burst signal based on the controlled timing.

Figure 3:
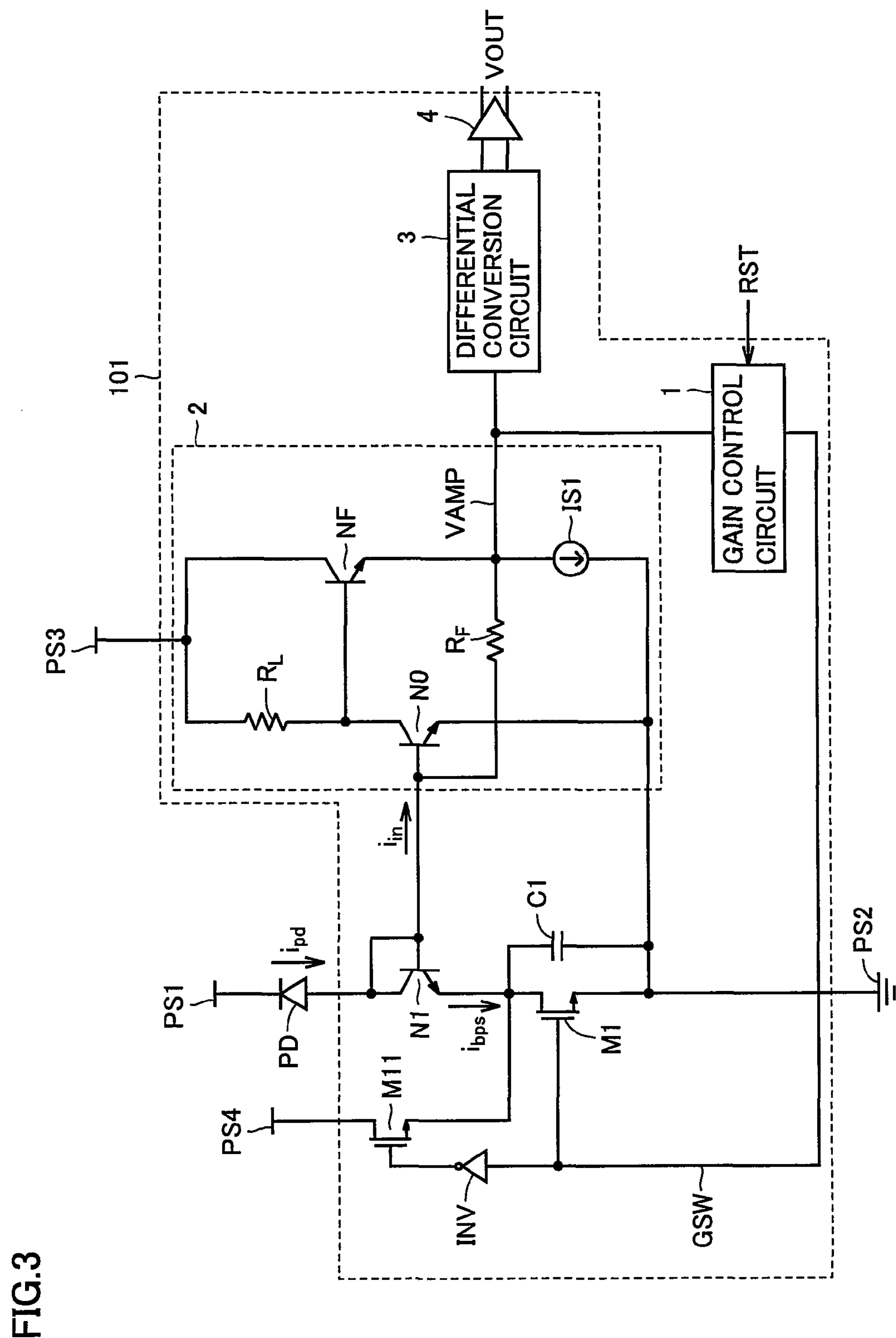
FIG. 3 is a circuit diagram showing the configuration of a preamplifier according to the first embodiment of the present invention.

FIG. 3 is a circuit diagram showing the configuration of the preamplifier according to the first embodiment of the present invention.

Referring to FIG. 3, preamplifier 101 includes a gain control circuit 1, an inverting amplifier circuit 2, a differential conversion circuit 3, an output buffer circuit 4, an NPN transistor N1, N-channel MOS transistors M1 and M11, a capacitor C1, and an inverter INV. Inverting amplification circuit 2 includes NPN transistors N0 and NF, a feedback resistance RF, a resistance RL, and a current source IS1.

NPN transistor N1 has a collector and a base connected to the anode of light receiving element PD, and an emitter connected to the drain of N-channel MOS transistor M1 and the first end of capacitor C1.

N-channel MOS transistor M1 has a gate receiving a gain switching signal GSW from gain control circuit 1 and a source connected to a ground voltage source PS2 and the second end of capacitor C1.

N-channel MOS transistor M11 has a gate connected to the output of inverter INV, a drain connected to a fixed voltage source PS4, and a source connected to the first end of capacitor C1.

NPN transistor N0 has a base connected to the base of NPN transistor N1 and the first end of feedback resistance RF, a collector connected to the first end of resistance RL and the base of NPN transistor NF, and an emitter connected to ground voltage source PS2. NPN transistor NF has a collector connected to a fixed voltage source PS3 and the second end of resistance RL, and an emitter connected to the second end of feedback resistance RF and the first end of current source IS1.

Current source IS1 has the second end connected to ground voltage source PS2. Light receiving element PD has a cathode connected to fixed voltage source PS1.

Differential conversion circuit 3 converts an output voltage VAMP of inverting amplifier circuit 2, that is, the emitter voltage of NPN transistor NF, into a differential signal, and outputs the resultant signal as an output signal VOUT through output buffer circuit 4 to terminal T1.

Feedback resistance RF is provided for feeding back output voltage VAMP, that is, the output of NPN transistor N0, to the base of NPN transistor N0.

N-channel MOS transistor M1 is provided for controlling the ratio between the current flowing from light receiving element PD into NPN transistor N0 and feedback resistance RF, and the current flowing from light receiving element PD through the collector and emitter of NPN transistor N1 into ground voltage source PS2.

Figure 4:
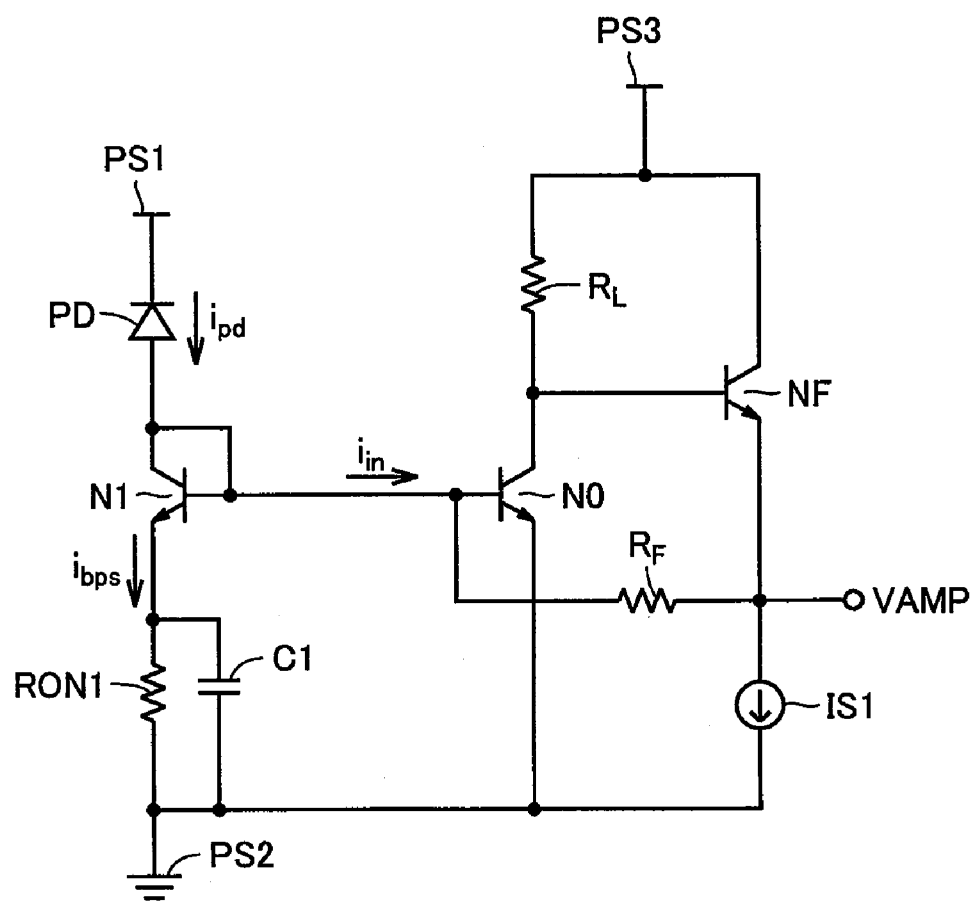
FIG. 4 is a circuit diagram showing the state where an N-channel MOS transistor M1 is turned on and an N-channel MOS transistor M11 is turned off in the preamplifier according to the first embodiment of the present invention.

FIG. 4 is a circuit diagram showing the state where N-channel MOS transistor M1 is turned on and N-channel MOS transistor M11 is turned off in the preamplifier according to the first embodiment of the present invention.

Gain control circuit 1 generates and outputs gain switching signal GSW based on output voltage VAMP. More specifically, at the leading edge of the light input signal serving as a burst signal, gain control circuit 1 outputs gain switching signal GSW of a logic low level to start receiving the light input signal. Then, gain control circuit 1 calculates the average value of the levels of output voltage VAMP in the period for a plurality of bits of the light input signal. When the average value of output voltage VAMP of inverting amplifier circuit 2 is less than a predetermined value, that is, the level of the light input signal is high, gain control circuit 1 outputs gain switching signal GSW of a logic high level, thereby causing N-channel MOS transistor M1 to be turned on. This leads to a decrease in the emitter potential of NPN transistor N1 to cause NPN transistor N1 to be turned on. This causes a bypass current ibps to flow from light receiving element PD through NPN transistor N1 and N-channel MOS transistor M1 into ground voltage source PS2. In other words, a detection current ipd from light receiving element PD is diverted into an input current iin toward inverting amplifier circuit 2 and into bypass current ibps. In this case, since the emitter of each of NPN transistors N0 and N1 is coupled to ground voltage source PS2, NPN transistors N0 and N1 each perform the operation in the same manner as a current mirror circuit, and the current corresponding to bypass current ibps flows from the collector into the emitter in NPN transistor N0. It is to be noted that the term "coupled" used herein is not limited to the state where circuit elements are directly connected to each other but includes the case where another circuit element is connected between the circuit elements.

Meanwhile, when the average value of output voltage VAMP is greater than or equal to a predetermined value, that is, the level of the light input signal is low, gain control circuit 1 outputs gain switching signal GSW of a logic low level, thereby causing N-channel MOS transistor M1 to be turned off. This leads to an increase in the emitter potential of NPN transistor N1 to cause NPN transistor N1 to be turned off. Consequently, detection current ipd from light receiving element PD is not diverted but flows through inverting amplifier circuit 2 as input current iin.

It is to be noted that gain control circuit 1 may be configured to detect, in place of the average value of the levels of output voltage VAMP, the bottom value of output voltage VAMP in the period for a plurality of bits of the light input signal at the leading edge of the light input signal serving as a burst signal, and determine the logic level of gain switching signal GSW based on this bottom value.

Inverter INV inverts the logic level of gain switching signal GSW received from gain control circuit 1, to output the resultant to the gate of N-channel MOS transistor M11.

Gain control circuit 1 receives reset signal RST from communication control unit 304 for each burst signal and turns on N-channel MOS transistor M11. This causes fixed voltage source PS4 to inject electric charges into capacitor C1, which allows the emitter potential of NPN transistor N1 to be immediately raised. In this case, the output voltage of fixed voltage source PS4 may be any voltage that is greater than the base-emitter voltage of NPN transistor N1. However, when N-channel MOS transistor M1 is turned from OFF to ON, it is preferable that the output voltage of fixed voltage source PS4 is close to the base-emitter voltage of NPN transistor N1 in order to shorten the time period for releasing electric charges from capacitor C1.

Furthermore, gain control circuit 1 receives reset signal RST from communication control unit 304 for each burst signal to clear the average value of output voltage VAMP. The light intensity of the burst signal may greatly vary for each premises device. When the average value of output voltage VAMP is cleared for each burst signal, the level of output voltage VAMP can be detected with accuracy with regard to the newly received burst signal to allow generation of gain switching signal GSW, without being influenced by the burst signal received in the past.

It is to be noted that gain control circuit 1 is not limited to the configuration in which reset signal RST is received from communication control unit 304, but may be configured to detect the start or the end of the burst signal on its own and reset the logic level of gain switching signal GSW to an initial value. Furthermore, when station side device 402 receives not the burst signal but the continuous signal, reset signal RST is not necessary.

In this case, assume that the mutual conductance of NPN transistor N0 is gm0, the gain of inverting amplifier circuit 2 is A, the resistance value of feedback resistance RF is RF, and the resistance value of resistance RL is RL. An AC impedance ZRF of feedback resistance RF from the input node of preamplifier 101, that is, the connection node between light receiving element PD and NPN transistor N1, is represented by the following equation.

[Equation 2]

$$Z_{RF} = \frac{R_F}{(1+A)} \approx \frac{R_F}{A} = \frac{1}{g_{m0}}\frac{R_F}{R_L} \tag{1}$$

Furthermore, assume that the base current of NPN transistor N0 is ib0, the base voltage is vb0, and the current gain is hfe0. An AC impedance Z0 of NPN transistor N0 from the input node of preamplifier 101 is represented by the following equation.

[Equation 3]

$$Z_0 = \frac{v_{b0}}{i_{b0}} \approx \frac{h_{fe0}}{g_{m0}} \tag{2}$$

In this case, it is generally assumed that hfe0>>(RF/RL). Accordingly, when comparing the equation (1) with the equation (2), the input impedance of preamplifier 101 corresponding to a feedback type TIA can be approximated by the equation (1).

Then, assume that the base current of NPN transistor N1 is ib1, the base voltage is vb1, the mutual conductance is gm1, the intrinsic emitter resistance is re1, and the current gain is hfe1. An AC impedance Z1 on the path of bypass current ibps from the input node of preamplifier 101 is represented by the following equation.

[Equation 4]

$$Z_1 = \frac{v_{b1}}{(1+h_{fe1})\times i_{b1}} = \frac{(1+h_{fe1})\times i_{b1}\times r_{e1}}{(1+h_{fe1})\times i_{b1}} = r_{e1} = \frac{1}{g_{m1}} \tag{3}$$

When N-channel MOS transistor M1 is turned off, each detection current ipd from light receiving element PD serves as an input current iin. In contrast, when N-channel MOS transistor M1 is turned on, detection current ipd is diverted into input current iin and bypass current ibps as in the following equation (4) based on the ratio between impedance ZRF represented by the equation (1) and impedance Z1 represented by the equation (3).

[Equation 5]

$$\begin{aligned} i_{in}: i_{bps} &= Z_1: Z_{RF} \\ &= \frac{1}{g_{m1}}: \frac{1}{g_{m0}} \times \frac{R_F}{R_L} \\ &= 1: \frac{g_{m1}}{g_{m0}} \times \frac{R_F}{R_L} \end{aligned} \tag{4}$$

In this case, NPN transistor N0 has the same base-emitter voltage as that of NPN transistor N1, and NPN transistor N1 has the same operating point as that of NPN transistor N0. Furthermore, NPN transistors N0 and N1 are configured in the same manner. Consequently, gm1/gm0 is determined depending on the size ratio between NPN transistors N0 and N1, which results in a value that is stabilized against manufacturing variations and temperature fluctuations.

It is to be noted that the "size of a transistor" used in the present invention refers to a structural size by which the mutual conductance of the transistor is determined. For example, in the case of the NPN transistor, the size is represented by emitter width×emitter length, and in the case of the N-channel MOS transistor, the size is represented by gate width×gate length. Furthermore, in the case where a plurality of transistors are connected in parallel, the size is represented by the sum of the sizes of transistors connected in parallel.

Similarly, feedback resistance RF and resistance RL are manufactured, for example, with the same type of devices such as poly resistance and metal resistance, that is, formed by the same material, which allows RF/RL to be equal to a value stabilized against manufacturing variations and temperature fluctuations.

Furthermore, since it is generally assumed that RF/RL>1, input current iin can be effectively suppressed by NPN transistor N1 that is comparable in size to NPN transistor N0.

For example, assuming that the resistance value of feedback resistance RF is 1000Ω, the resistance value of resistance RL is 200Ω, and NPN transistors N0 and N1 are equally sized, that is, gm1/gm0=1, the ratio between input current un and bypass current ibps is represented by the following equation.

[Equation 6]

$$\begin{aligned} i_{in}: i_{bps} &= 1: \frac{g_{m1}}{g_{m0}} \times \frac{R_F}{R_L} \\ &= 1: \frac{1}{1} \times \frac{1000}{200} \\ &= 1: 5 \end{aligned} \tag{5}$$

In this way, when N-channel MOS transistor M1 is turned on, input current Iin can be reduced to one sixth as compared with the case where N-channel MOS transistor M1 is turned off. Consequently, the strong input resistance of preamplifier 101 can be increased by 6 times.

A gain ZT of preamplifier 101 at the time when N-channel MOS transistor M1 is turned off is represented by the following equation.

[Equation 7]

$$Z_T = \frac{A}{1+A} \times R_F \approx R_F \quad (6)$$

Furthermore, gain ZT of preamplifier 101 at the time when N-channel MOS transistor M1 is turned on is represented by the following equation.

[Equation 8]

$$Z_T = \frac{1}{1 + \frac{g_{m1}}{g_{m0}} \times \frac{R_F}{R_L}} \times \frac{A}{1+A} \times R_F \approx \frac{1}{1 + \frac{g_{m1}}{g_{m0}} \times \frac{R_F}{R_L}} \times R_F \quad (7)$$

As described above, in the preamplifier according to the first embodiment of the present invention, the diversion ratio of detection current ipd from light receiving element PD, that is, the ratio between input current iin and bypass current ibps, is controlled based on output voltage VAMP. According to this configuration, bypass current ibps is determined depending on the ratio with respect to detection current ipd, which allows the amount of bypass current ibps to be increased in the case of a strong input and also allows the amount of bypass current ibps to be decreased in the case of a weak input. Consequently, it becomes possible to prevent the dynamic range of preamplifier 101 from being narrowed due to saturation of inverting amplifier circuit 2, and also prevent deterioration of the S/N ratio. Furthermore, the diversion ratio of detection current ipd exhibits a value that is determined depending on the ratio of each resistance and the ratio of each mutual conductance of the transistors and stabilized against manufacturing variations and temperature fluctuations. Thus, parameter adjustment can be facilitated.

Furthermore, in the preamplifier according to the first embodiment of the present invention, output signal VOUT is monitored, and when the level of the light input signal is high, N-channel MOS transistor M1 is turned on. This causes a part of detection current ipd from light receiving element PD to be bypassed as bypass current ibps to the ground, to reduce input current iin into inverting amplifier circuit 2, thereby reducing the apparent gain of preamplifier 101. This configuration eliminates the need to switch the resistance value of the feedback resistance, which allows elimination of the need to control the phase margin without causing any change in the characteristics of the feedback loop before and after switching the gain.

Furthermore, in the high-frequency TIA, the input impedance, that is, the resistance value of the feedback resistance, is set to be small as compared with the low-frequency TIA, in order to implement a high-speed operation. For this reason, assuming that preamplifier 101 shown in FIG. 3 is applied, it is necessary to reduce the resistance component of the path of bypass current ibps, that is, to lower the on-resistance of N-channel MOS transistor M1. However, the on-resistance of N-channel MOS transistor M1 exhibits a parameter which is difficult to be controlled due to significant manufacturing variations and temperature fluctuations. Accordingly, N-channel MOS transistor M1 should be increased in size in order to lower the on-resistance to a negligible level. In this case, the increased parasitic capacitance at the input node of the preamplifier makes it difficult to perform a high frequency operation.

However, in the preamplifier according to the first embodiment of the present invention, N-channel MOS transistor M1 is connected between the emitter of NPN transistor N1 and ground voltage source PS2. Accordingly, since NPN transistor N1 operates in the state where the emitter is grounded, the parasitic capacitance of N-channel MOS transistor M1 is not apparent from the input node of the preamplifier. In addition, the greater the parasitic capacitance of N-channel MOS transistor M1 is, the more strongly the emitter of NPN transistor N1 is grounded in the high frequency region. In other words, the operation of NPN transistor N1 in the high frequency region can be stabilized while reducing the on-resistance of N-channel MOS transistor M1.

Furthermore, assuming that the base-emitter capacitance of NPN transistor N0 is Cbe0 and the base-collector capacitance is Cbc0, the capacitance of Cbe0+(1+A)×Cbc0 is apparent from the input node. It is to be noted that (1+A) results from the Mirror effect. In contrast, as for the capacitance of NPN transistor N1 that is apparent from the input node, only base-emitter capacitance Cbe1 needs to be taken into consideration. Consequently, the influence of NPN transistor N1 exerted on the input capacitance of preamplifier 101 can be suppressed.

Furthermore, the preamplifier disclosed in Patent Document 1 is configured to select whether or not to divert the output current of the avalanche photodiode for each one bit of the light input signal. This requires a high-speed control loop to be provided, which makes it difficult to achieve a wider bandwidth.

However, in the preamplifier according to the first embodiment of the present invention, gain control circuit 1 calculates the average value of the levels of output voltage VAMP during the period for a plurality of bits of the light input signal at the leading edge of the burst signal. Gain control circuit 1 then generates gain switching signal GSW based on the average value of output voltage VAMP. In the subsequent section of the burst signal, gain switching signal GSW only needs to be fixed, in which case, the control loop does not operate. This configuration eliminates the need to provide a high-speed control loop, thereby allowing a wider bandwidth to be readily achieved.

It is to be noted that each of NPN transistors N0 and N1 may be a transistor other than a bipolar transistor and can be replaced with an N-channel MOS transistor, for example. Furthermore, capacitor C1 does not need to be provided when N-channel MOS transistor M1 has sufficient parasitic capacitance.

Another embodiment of the present invention will then be described with reference to the drawings, in which the same or corresponding components are designated by the same reference characters, and description thereof will not be repeated.

Second Embodiment

The present embodiment relates to a preamplifier which is improved in the matching of the circuit as compared to the preamplifier according to the first embodiment.

Figure 5:
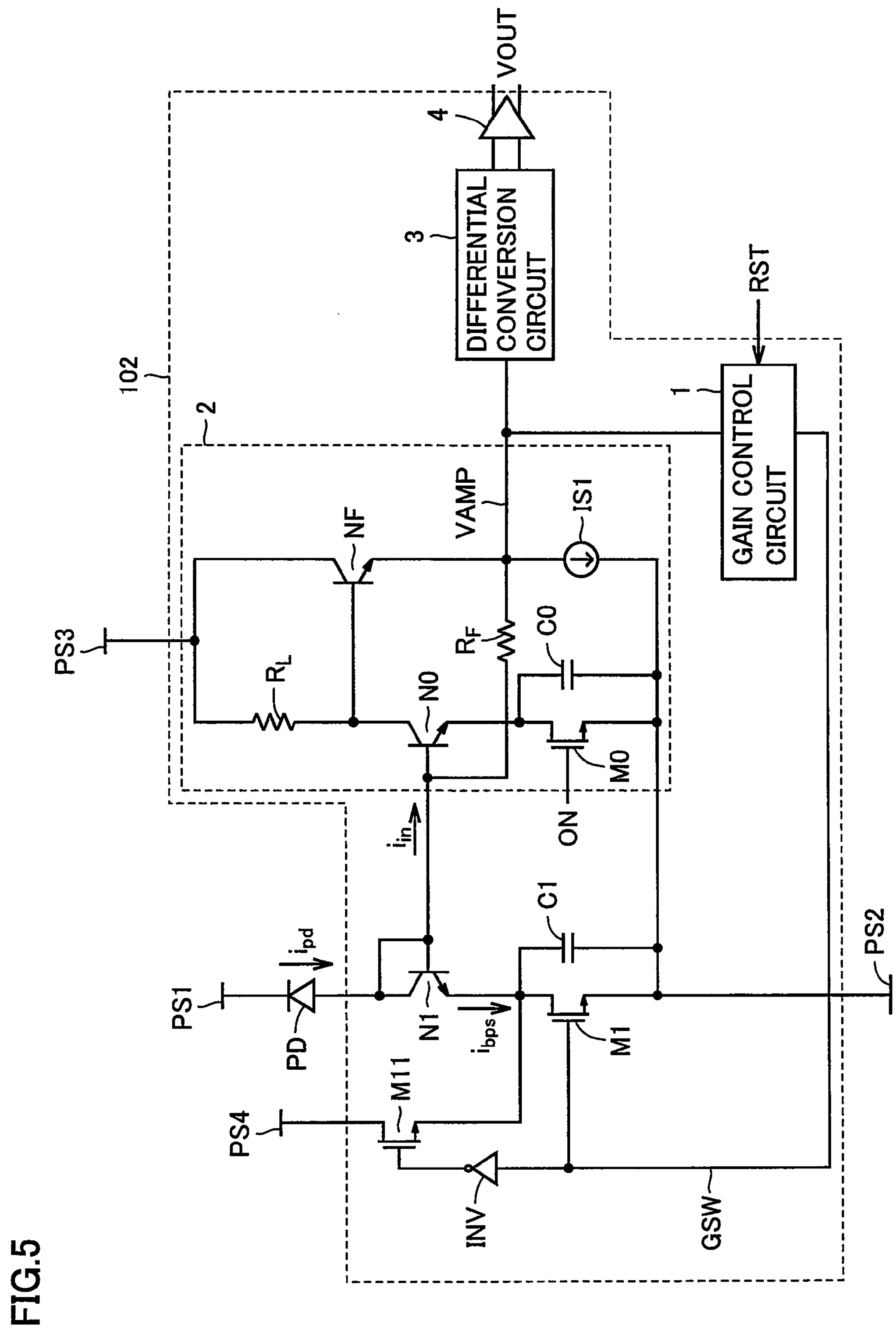
FIG. 5 is a diagram showing the configuration of a preamplifier according to the second embodiment of the present invention.
Figure 6:
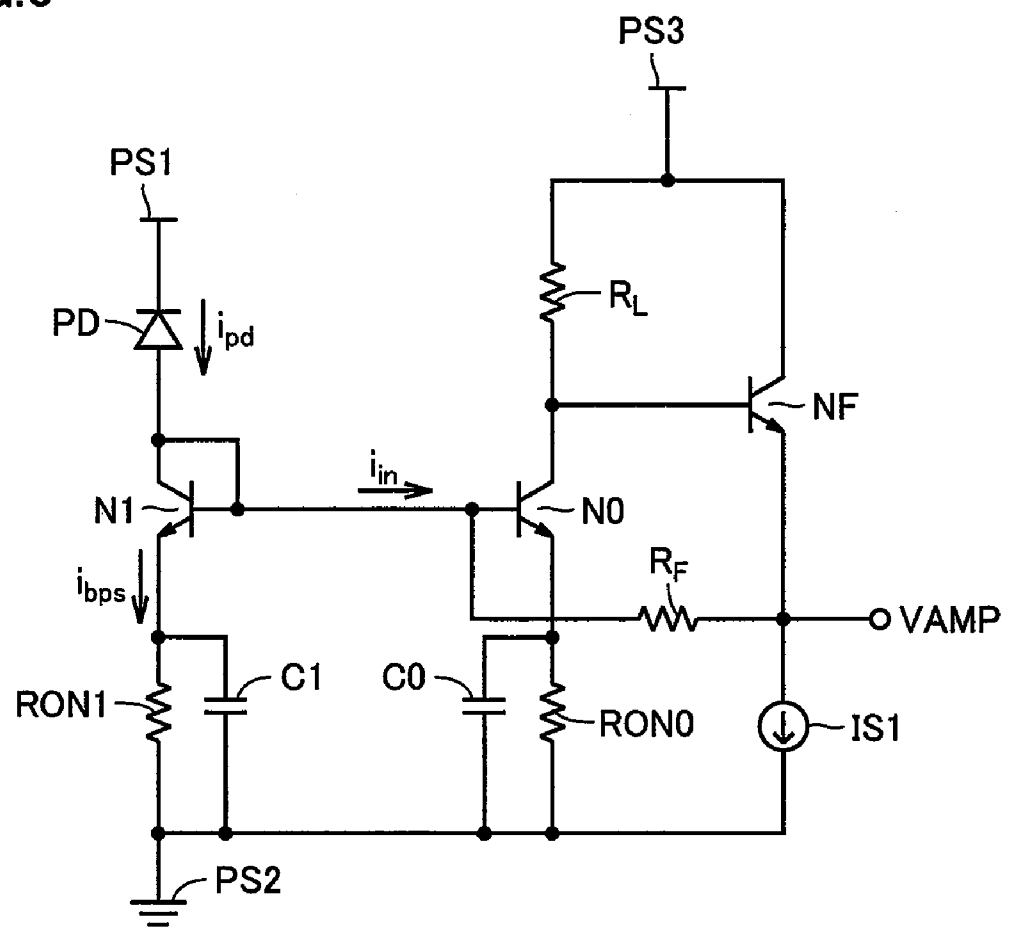
FIG. 6 is a circuit diagram showing the state where N-channel MOS transistors M0 and M1 are turned on and N-channel MOS transistor M11 is turned off in the preamplifier according to the second embodiment of the present invention.

FIG. 5 is a diagram showing the configuration of the preamplifier according to the second embodiment of the present invention. FIG. 6 is a circuit diagram showing the state where N-channel MOS transistors M0 and M1 are turned on and N-channel MOS transistor M11 is turned off in the preamplifier according to the second embodiment of the present invention.

Referring to FIG. 5, a preamplifier 102 is different from the preamplifier according to the first embodiment of the present invention in that it further includes N-channel MOS transistor M0 and a capacitor C0.

N-channel MOS transistor M0 has a drain connected to the emitter of NPN transistor N0 and the first end of capacitor C0, a source connected to ground voltage source PS2 and the second end of capacitor C0, and a gate.

N-channel MOS transistor M0 has a gate which is continuously supplied with a voltage for turning on N-channel MOS transistor M0.

Furthermore, the transistors are sized to achieve the ratio in which the size of N-channel MOS transistor M0:the size of N-channel MOS transistor M1=the size of NPN transistor N0:the size of NPN transistor N1.

In the preamplifier according to the first embodiment of the present invention, N-channel MOS transistor M1 is increased in size to allow its on-resistance to be reduced to some extent. However, the reduced on-resistance of N-channel MOS transistor M1 causes a potential difference between the emitter of NPN transistor N0 and the emitter of NPN transistor N1.

In the preamplifier according to the second embodiment of the present invention, however, the matching of the circuit is improved by insertion of N-channel MOS transistor M0 between the emitter of NPN transistor N0 and the ground. Consequently, the potential difference between the emitter of NPN transistor N0 and the emitter of NPN transistor N1 can be reduced to thereby allow reduction in characteristics variation resulting from the variations in the on-resistance of N-channel MOS transistor M0.

Since other configurations and operations are the same as those of the preamplifier according to the first embodiment, detailed description thereof will not be repeated.

Still another embodiment of the present invention will then be described with reference to the drawings, in which the same or corresponding components are designated by the same reference characters, and description thereof will not be repeated.

Third Embodiment

The present embodiment relates to a preamplifier in which the transistor for gain switching is arranged differently from the case of the preamplifier according to the first embodiment.

Figure 7:
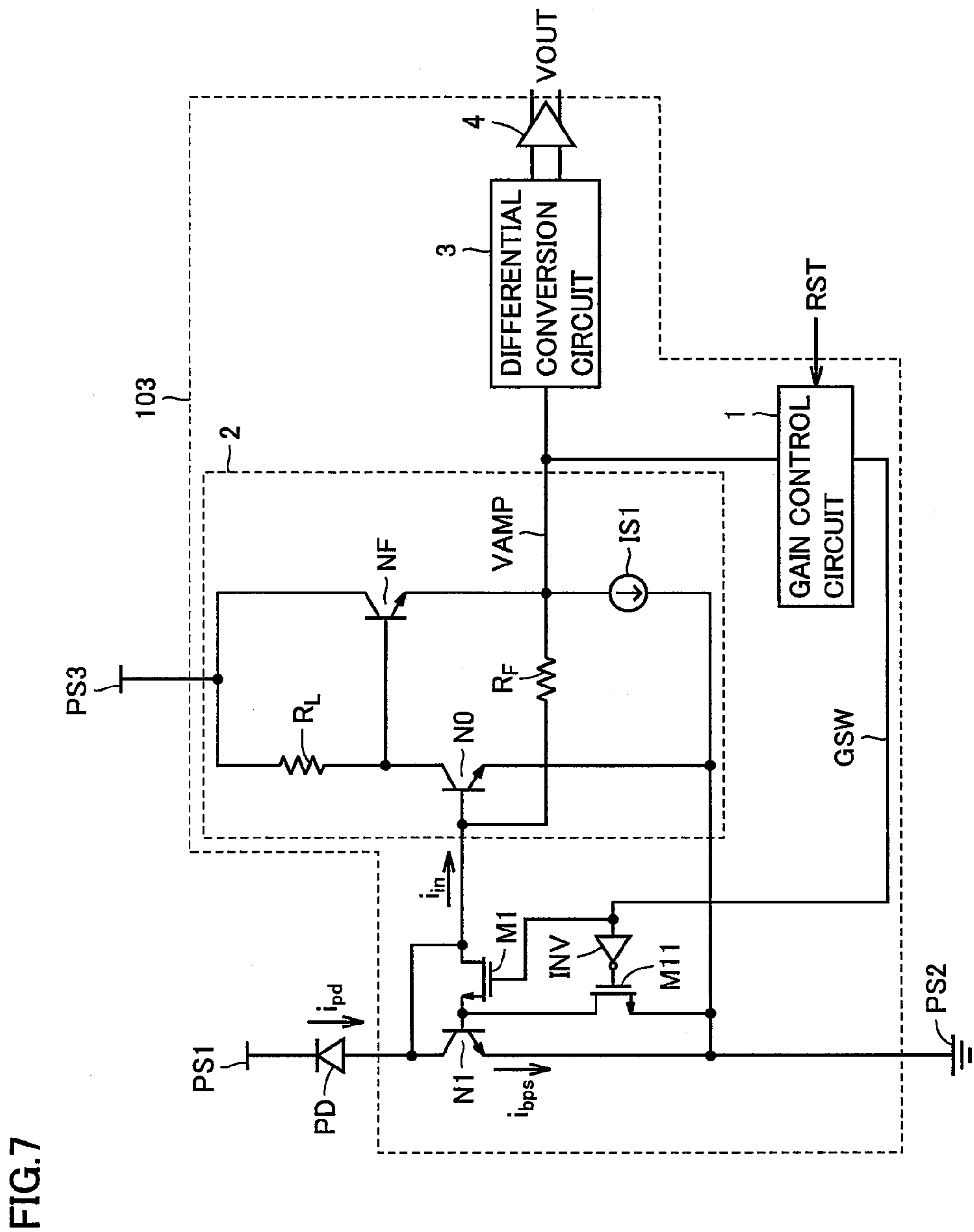
FIG. 7 is a diagram showing the configuration of a preamplifier according to the third embodiment of the present invention.
Figure 8:
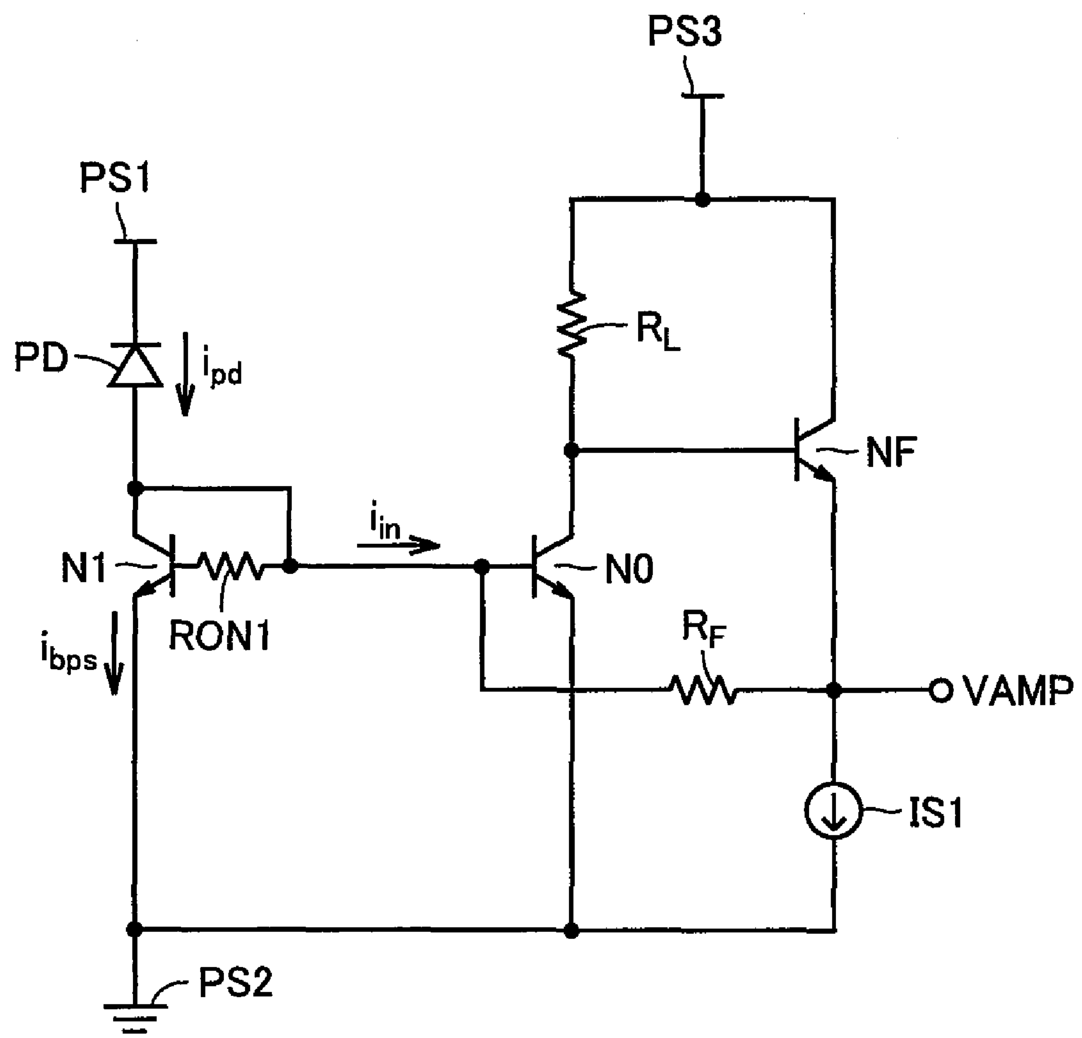
FIG. 8 is a circuit diagram showing the state where N-channel MOS transistor M1 is turned on and N-channel MOS transistor M11 is turned off in the preamplifier according to the third embodiment of the present invention.

FIG. 7 is a diagram showing the configuration of the preamplifier according to the third embodiment of the present invention. FIG. 8 is a circuit diagram showing the state where N-channel MOS transistor M1 is turned on and N-channel MOS transistor M11 is turned off in the preamplifier according to the third embodiment of the present invention.

Referring to FIG. 7, N-channel MOS transistor M1 for gain switching is disposed at the base node of NPN transistor N1. In other words, N-channel MOS transistor M1 has a source connected to the base of NPN transistor N1, a drain connected to the collector of NPN transistor N1, the base of NPN transistor N0 and the first end of feedback resistance RF, and a gate receiving gain switching signal GSW from gain control circuit 1.

Furthermore, N-channel MOS transistor M11 has a drain connected to the source of N-channel MOS transistor M1 and the base of NPN transistor N1, and a source connected to ground voltage source PS2.

Gain control circuit 1 calculates the average value of the levels of output voltage VAMP of inverting amplifier circuit 2 during the period for a plurality of bits of the light input signal. When the average value of output voltage VAMP is less than a predetermined value, gain control circuit 1 then outputs gain switching signal GSW of a logic high level to cause N-channel MOS transistor M1 to be turned on. This leads to an increase in the base potential of NPN transistor N1, to cause NPN transistor N1 to be turned on. Consequently, bypass current ibps flows from light receiving element PD through NPN transistor N1 into ground voltage source PS2. In other words, detection current ipd from light receiving element PD is diverted into input current iin toward inverting amplifier circuit 2 and into bypass current ibps. In this case, NPN transistors N0 and N1 each perform the operation in the manner similar to a current mirror circuit, and the current corresponding to bypass current ibps flows from the collector into the emitter in NPN transistor N0.

On the other hand, when the average value of output voltage VAMP is greater than or equal to the predetermined value, gain control circuit 1 outputs gain switching signal GSW of a logic low level to cause N-channel MOS transistor M1 to be turned off and N-channel MOS transistor M11 to be turned on. This causes the base potential of NPN transistor N1 to be equal to the ground potential, with the result that NPN transistor N1 is turned off. Consequently, detection current ipd from light receiving element PD is not diverted but flows as input current un into inverting amplifier circuit 2.

It is to be noted that gain control circuit 1 may be configured to detect, in place of the average value of the levels of output voltage VAMP, the bottom value of output voltage VAMP in the period for a plurality of bits of the light input signal at the leading edge of the light input signal serving as a burst signal, and determine the logic level of gain switching signal GSW based on this bottom value.

Assuming that the on-resistance of N-channel MOS transistor M1 is RON1, impedance Z1 of the bypass path from the input node of a preamplifier 103 is represented by the following equation.

[Equation 9]

$$\begin{aligned} Z_1 &= \frac{v_{b1}}{(1+h_{fe1})\times i_{b1}} \\ &= \frac{v_{b1}}{(1+h_{fe1})\times \dfrac{v_{b1}}{R_{ON1} r_{e1}}} \\ &= \frac{r_{e1}}{1+h_{fe1}} + \frac{R_{ON1}}{1+h_{fe1}} \\ &= \frac{1}{g_{m1}} + \frac{R_{ON1}}{1+h_{fe1}} \end{aligned} \tag{8}$$

The base node of NPN transistor N1 is a high frequency line and is sensitive to parasitic capacitance. Accordingly, it is difficult to increase the size of N-channel MOS transistor M1.

However, based on the equation (8), on-resistance RON1 equals to 1/(hfe1+1) in which it is generally assumed that hfe1>100. Accordingly, even in the case where the size of N-channel MOS transistor M1 is relatively small and on-resistance RON1 is large, the condition where 1/gm1>>RON1/(1+hfe1) is achieved, which allows approximation to Z1~1/gm1. In other words, since the equation (8) can be approximated to the equation (3), the similar effects obtained by the preamplifier according to the first embodiment of the present invention can be achieved.

In this case, when N-channel MOS transistor M1 is turned off, N-channel MOS transistor M11 is separated from the signal line of preamplifier 103, that is, the path of detection current ipd. Accordingly, the parasitic capacitance of N-channel MOS transistor M11 exerts no influence on the characteristics of preamplifier 103.

Furthermore, when N-channel MOS transistor M1 is turned on, the parasitic capacitance of N-channel MOS transistor M11 has an influence on the signal line of preamplifier 103. However, N-channel MOS transistor M11 designed in a small size can be used, which allows its influence to be reduced to a minimum level. Furthermore, when N-channel MOS transistor M1 is turned on, the level of the light input signal is high. Accordingly, even when the bandwidth of preamplifier 103 is narrowed by the parasitic capacitance of N-channel MOS transistor M11, the characteristics of preamplifier 103 is less influenced.

Since other configurations and operations are the same as those of the preamplifier according to the first embodiment, detailed description thereof will not be repeated.

Still another embodiment of the present invention will then be described with reference to the drawings, in which the same or corresponding components are designated by the same reference characters, and description thereof will not be repeated.

Fourth Embodiment

The present embodiment relates to a preamplifier which is different from the preamplifier according to the first embodiment in that a DC bias current is enhanced.

Figure 9:
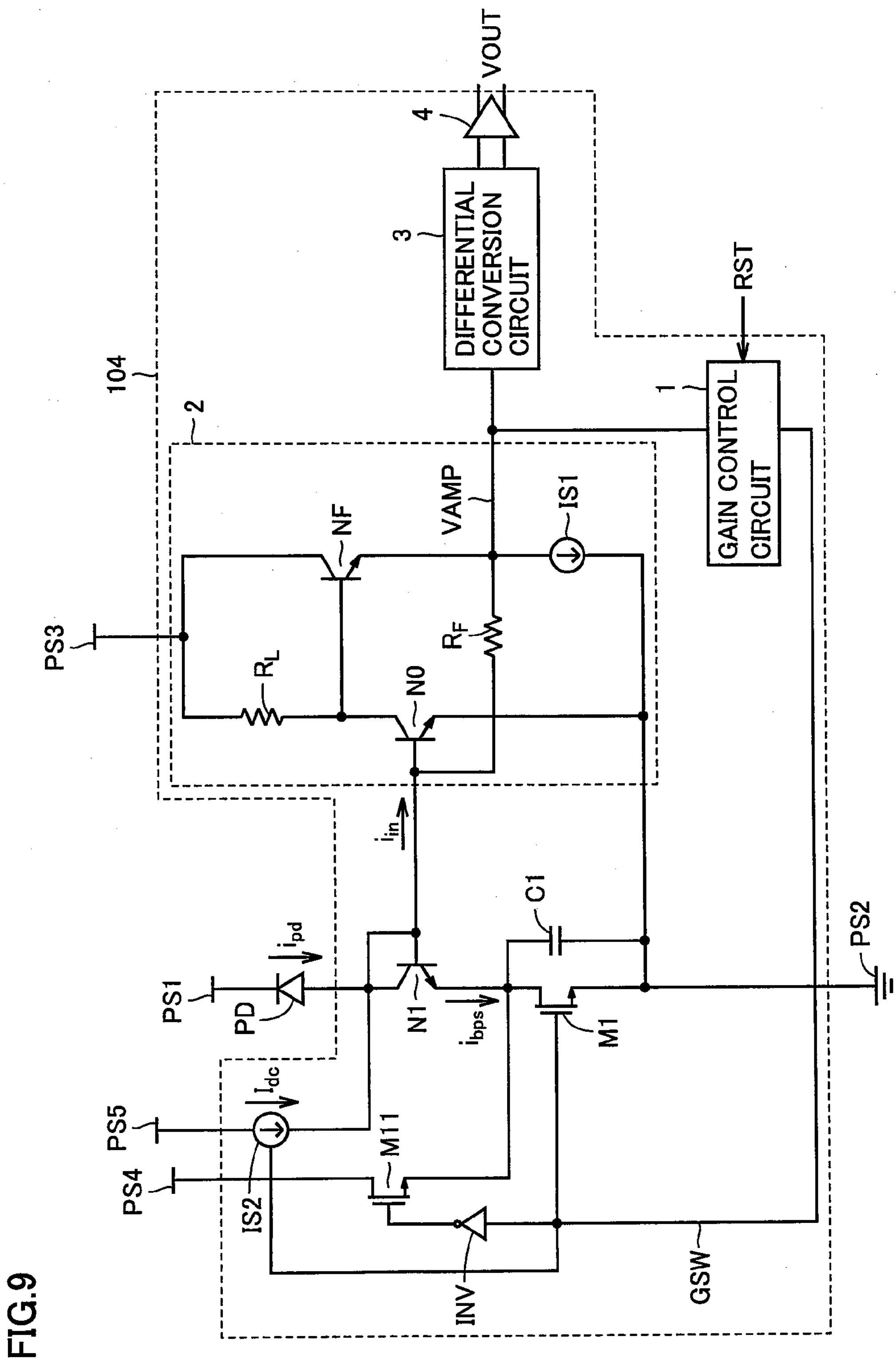
FIG. 9 is a diagram showing the configuration of a preamplifier according to the fourth embodiment of the present invention.

FIG. 9 is a diagram showing the configuration of the preamplifier according to the fourth embodiment of the present invention.

Referring to FIG. 9, a preamplifier 104 is different from the preamplifier according to the first embodiment of the present invention in that it further includes a current source IS2.

Current source IS2 is connected between a fixed voltage source PS5 and the collector of NPN transistor N1.

Current source IS2 receives gain switching signal GSW of a logic high level and supplies a constant current Idc to the collector of NPN transistor N1.

NPN transistor N1 in each of preamplifiers 101 to 103 requires a DC bias current Ibias when it is in the ON state. This DC bias current Ibias is provided by detection current ipd and inverting amplifier circuit 2.

In the case where detection current ipd is large, when the gain of the preamplifier is switched to the lower level in the state where N-channel MOS transistor M1 is turned on, the DC bias current of NPN transistor N1 can be covered by detection current ipd.

On the other hand, in the case where detection current ipd is small, when the gain of the preamplifier is switched to the lower level in the state where N-channel MOS transistor M1 is turned on, a sufficient DC bias current cannot be obtained from detection current ipd. Accordingly, inverting amplifier circuit 2 attempts to supply shortages. In this case, however, when inverting amplifier circuit 2 is not capable of supplying sufficient current, the potential at the input node of the preamplifier is decreased, and the potential at the output node of the preamplifier, that is, the emitter of NPN transistor NF, is increased. Consequently, the base-emitter voltage of NPN transistor N0 and the base-emitter voltage of NPN transistor NF are decreased, which may lead to a reduction in the operation speed of the preamplifier.

However, in the preamplifier according to the fourth embodiment of the present invention, when the gain of the preamplifier is switched to the lower level in the state where N-channel MOS transistor M1 is turned on, current source IS2 supplies constant current Idc to the collector of NPN transistor N1. This configuration allows a sufficient DC bias current to be ensured even when detection current ipd is diverted.

Since other configurations and operations are the same as those of the preamplifier according to the first embodiment, detailed description thereof will not be repeated.

Still another embodiment of the present invention will then be described with reference to the drawings, in which the same or corresponding components are designated by the same reference characters, and description thereof will not be repeated.

Fifth Embodiment

The present embodiment relates to a preamplifier which is different from the preamplifier according to the first embodiment in that multistage gain switching is allowed.

Figure 10:
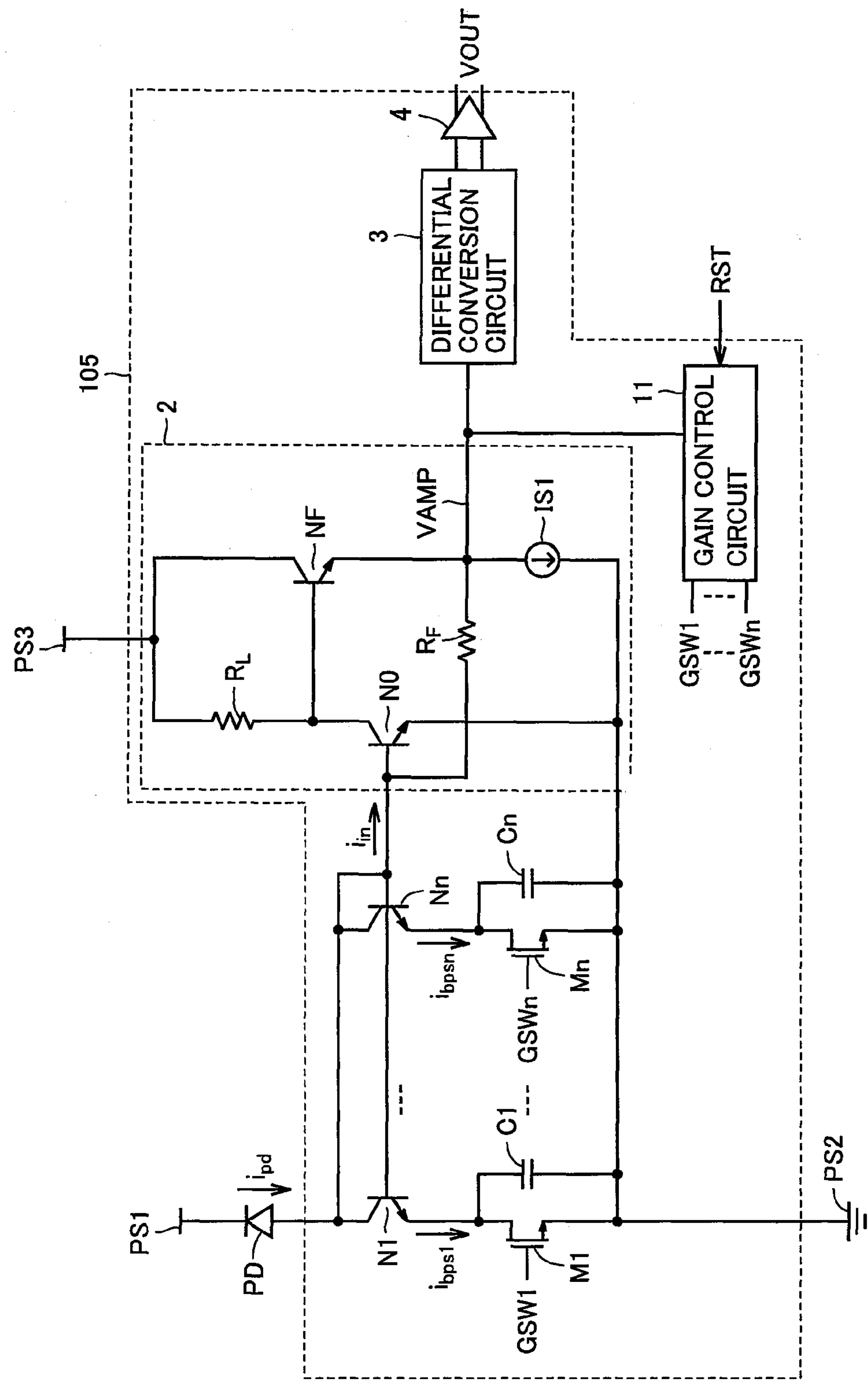
FIG. 10 is a diagram showing the configuration of a preamplifier according to the fifth embodiment of the present invention.

FIG. 10 is a diagram showing the configuration of the preamplifier according to the fifth embodiment of the present invention.

Referring to FIG. 10, a preamplifier 105 includes a gain control circuit 11 in place of gain control circuit 1, and further includes a plurality of sets each having N-channel MOS transistor M1 and capacitor C1 similar to those of the preamplifier according to the first embodiment of the present invention. In other words, preamplifier 105 includes gain control circuit 11, inverting amplifier circuit 2, NPN transistors N1 to Nn, N-channel MOS transistors M1 to Mn, and capacitors C1 to Cn.

NPN transistors N1 to Nn have their respective collectors commonly connected to the anode of light receiving element PD; their respective bases commonly connected to the base of NPN transistor N0 and the first end of feedback resistance RF; and their respective emitters connected to the corresponding drains of N-channel MOS transistors M1 to Mn and the corresponding first ends of capacitors C1 to Cn.

Preamplifier 105 is provided with a plurality of bypass paths, by which multistage gain switching is allowed.

Gain control circuit 11 generates gain switching signals GSW1 to GSWn based on output voltage VAMP, and outputs the signals to the gates of N-channel MOS transistors M1 to Mn, respectively. When N-channel MOS transistors M1 to Mn each are in the ON state, bypass currents ibps1 to ibpsn flow therethrough, respectively. By selecting, from N-channel MOS transistors M1 to Mn, one or more of N-channel MOS transistors which are to be brought into the ON state, multistage gain switching can be allowed. Furthermore, as compared to the configuration in which multistage gain switching is performed with provision of a plurality of feedback resistances connected in parallel, gain adjustment can be readily made by adjusting the size of each of NPN transistors N1 to Nn.

It is to be noted that preamplifier 105 may be configured to include a plurality of matching N-channel MOS transistors M0 similar to those of the preamplifier according to the second embodiment of the present invention, corresponding to N-channel MOS transistors M1 to Mn. Furthermore, preamplifier 105 may be configured to include current source IS2 for supplying a DC bias current as in the preamplifier according to the third embodiment of the present invention.

Since other configurations and operations are the same as those of the preamplifier according to the first embodiment, detailed description thereof will not be repeated.

Still another embodiment of the present invention will then be described with reference to the drawings, in which the same or corresponding components are designated by the same reference characters, and description thereof will not be repeated.

Sixth Embodiment

The present embodiment relates to a preamplifier which is different from the preamplifier according to the first embodiment in that the resistance value of the bypass path can be continuously changed.

Figure 11:
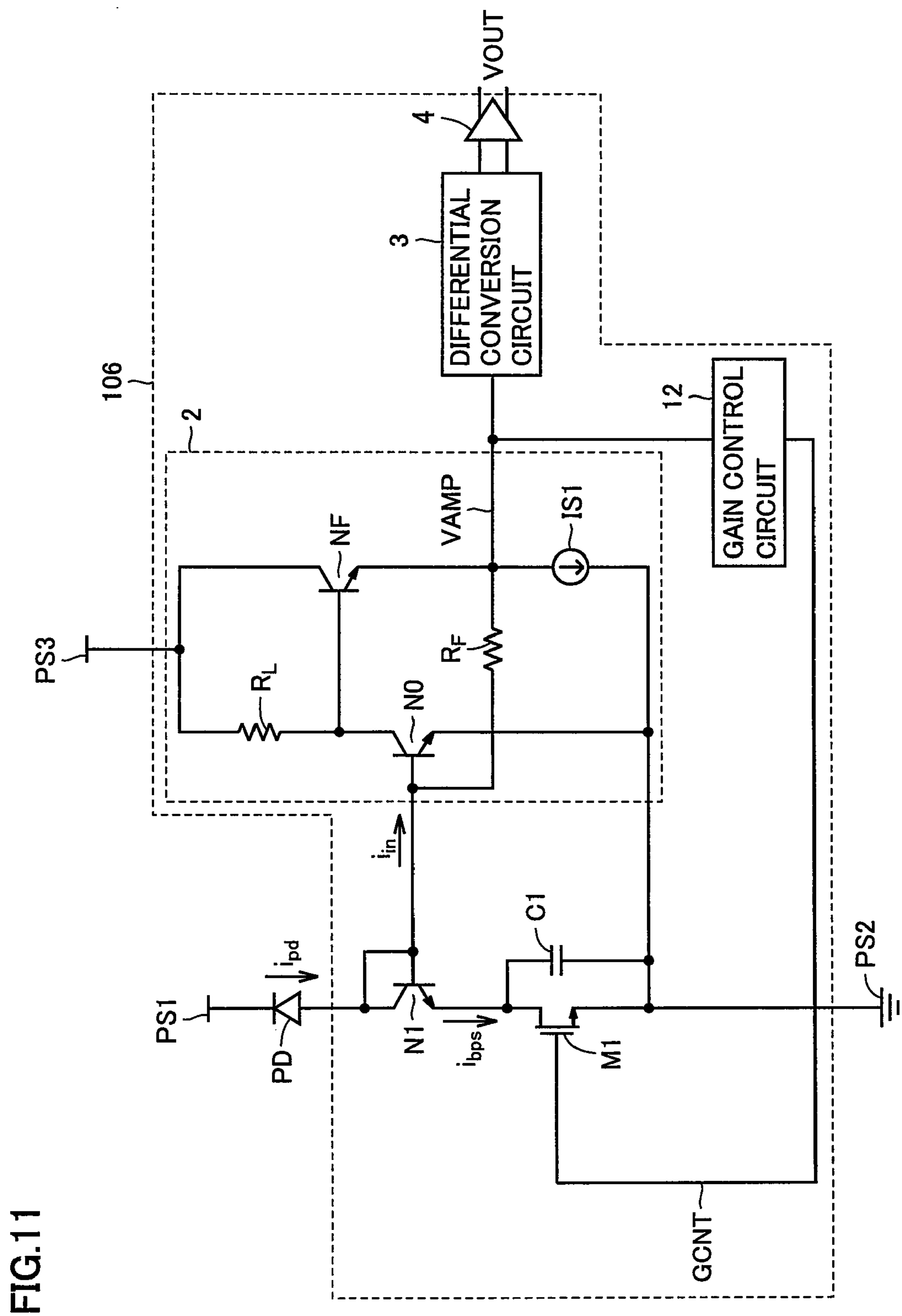
FIG. 11 is a diagram showing the configuration of a preamplifier according to the sixth embodiment of the present invention.
Figure 12:
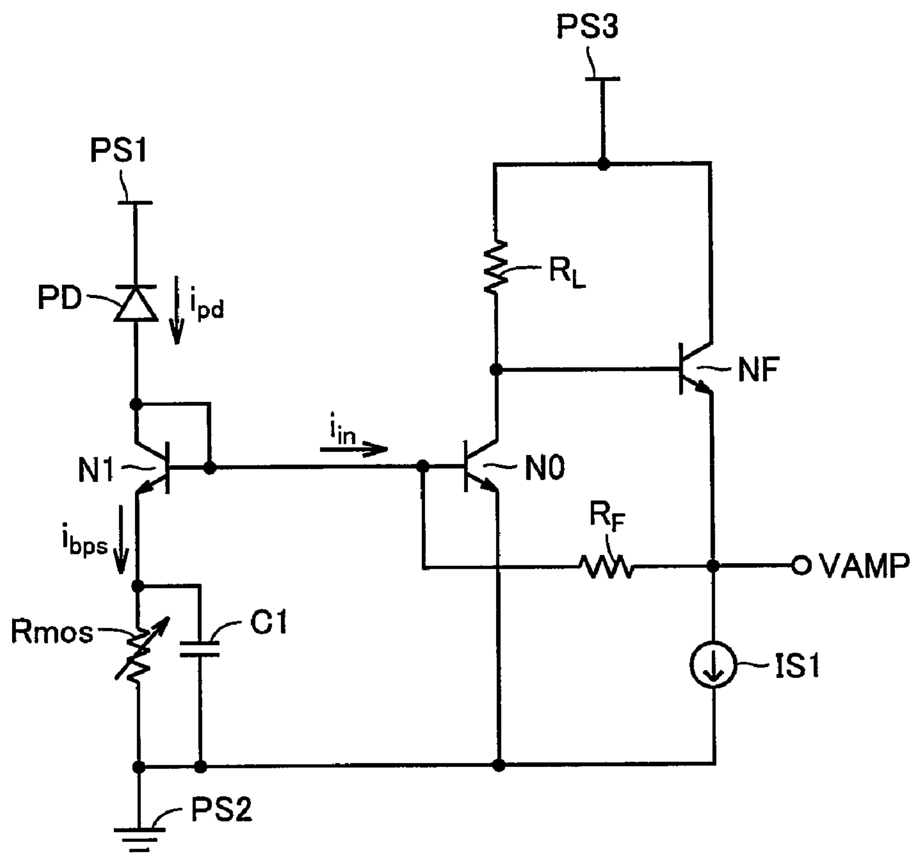
FIG. 12 is a circuit diagram showing the state where N-channel MOS transistor M1 is turned on in the preamplifier according to the sixth embodiment of the present invention.
Figure 13:
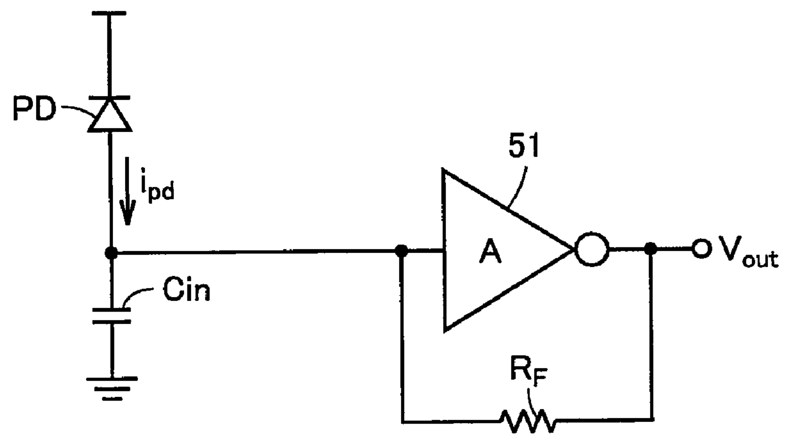
FIG. 13 is a diagram schematically showing the configuration of the preamplifier disclosed in Patent Documents 2 and 3.

FIG. 11 is a diagram showing the configuration of the preamplifier according to the sixth embodiment of the present invention. FIG. 12 is a circuit diagram showing the state where N-channel MOS transistor M1 is turned on in the preamplifier according to the sixth embodiment of the present invention.

Referring to FIG. 11, a preamplifier 106 is different from the preamplifier according to the first embodiment of the present invention in that it includes a gain control circuit 12 in place of gain control circuit 1. In contrast to gain control circuit 1, gain control circuit 12 does not receive reset signal RST. Furthermore, preamplifier 106 does not include N-channel MOS transistor M11 and inverter INV in contrast to the preamplifier according to the first embodiment of the present invention.

Gain control circuit 12 generates a gain control signal GCNT based on the average value of output voltage VAMP, and outputs the signal to the gate of N-channel MOS transistor M1. More specifically, based on output voltage VAMP, gain control circuit 12 controls the voltage value of gain control signal GCNT continuously, that is, in three or more stages, thereby continuously controlling the on-resistance of N-channel MOS transistor M1. In other words, as shown in FIG. 12, N-channel MOS transistor M1 functions as a variable resistance.

Therefore, since the emitter potential of NPN transistor N1, that is, the base-emitter voltage, can be continuously controlled, a mutual conductance gm1 can be continuously controlled.

In this case, in preamplifiers 101 to 105, switching of the gain causes a change in the DC potential at the output node. For this reason, in the case where a reception error occurs at the time of gain switching during reception of a communication signal, preamplifiers 101 to 105 are not suitable for the communication system to and from which a continuous signal is transmitted and received. In contrast, preamplifiers 101 to 105 are suitable in the case where, as in the premises device of the passive optical network, the light input signal serves as a burst signal and the power of the light input signal may vary for each premises device. Since the gain can be determined and fixed for each burst signal upon starting of reception of the burst signal, the gain is not switched during reception of the communication signal, with the result that no reception error occurs. Therefore, when preamplifiers 101 to 105 are provided in optical module 301 having terminal T2 for receiving reset signal RST, an optical module suitable for PON can be achieved which allows a dynamic range to be extended and a wideband signal to be amplified with stability.

In contrast, in the preamplifier according to the sixth embodiment of the present invention, in the state where N-channel MOS transistor M1 is completely turned on, the amplification characteristics similar to those of the preamplifier according to the first embodiment of the present invention may be achieved. However, the gain of preamplifier 106 can be continuously changed by continuously controlling the gate voltage value of N-channel MOS transistor M1, that is, the level of gain control signal GCNT. Consequently, the continuous signal can be successfully received. Furthermore, the feedback loop is configured such that the level at the output node is monitored to control gain control signal GCNT, that is, the gate voltage of N-channel MOS transistor M1, in accordance with the level of the light input signal. This configuration allows the characteristics variation of N-channel MOS transistor M1 to be addressed. The feedback loop does not need to be responsive to the light input signal for each one bit as in the configuration disclosed in Patent Document 1, but only needs to be responsive, for example, to the average value of the levels of output voltage VAMP during the period for a plurality of bits of the light input signal. Therefore, a wider bandwidth can readily be achieved.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

The invention claimed is:

1. An amplifier comprising:

a first transistor having a first conducting electrode receiving a current, a control electrode coupled to said first conducting electrode, and a second conducting electrode coupled to a fixed voltage source;

a second transistor having a first conducting electrode, a second conducting electrode coupled to said fixed voltage source, and a control electrode coupled to the control electrode of said first transistor;

a feedback resistance coupled to the control electrode of said second transistor for feeding back an output of said second transistor to the control electrode of said second transistor; and a variable resistance element for controlling a ratio between a current flowing from the first conducting electrode of said first transistor into the control electrode of said second transistor and said feedback resistance, and a current flowing from the first conducting electrode into the second conducting electrode in said first transistor.

2. The amplifier according to claim 1, wherein said variable resistance element is connected between the second conducting electrode of said first transistor and said fixed voltage source.

3. The amplifier according to claim 2, wherein said variable resistance element is a third transistor having a first conducting electrode coupled to the second conducting electrode of said first transistor and a second conducting electrode coupled to said fixed voltage source, and said amplifier further comprises a fourth transistor having a first conducting electrode coupled to the second conducting electrode of said second transistor and a second conducting electrode coupled to said fixed voltage source.

4. The amplifier according to claim 3, wherein a ratio between a size of said first transistor and a size of said second transistor is approximately equal to a ratio between a size of said third transistor and a size of said fourth transistor.

5. The amplifier according to claim 1, wherein said variable resistance element is connected between the control electrode of said first transistor, and the first conducting electrode of said first transistor and the control electrode of said second transistor.

6. The amplifier according to claim 1, wherein said first transistor is identical in configuration to said second transistor, and said amplifier further comprises a resistance coupled to the first conducting electrode of said second transistor and formed of a material identical to a material of said feedback resistance.

7. The amplifier according to claim 1, wherein said amplifier further comprises a current source supplying a constant current to the first conducting electrode of said first transistor.

8. The amplifier according to claim 1, wherein said amplifier comprises a plurality of sets each including said first transistor and said variable resistance element, and the first conducting electrode and the control electrode of each said first transistor are commonly coupled to the control electrode of said second transistor.

9. The amplifier according to claim 1, wherein said amplifier further comprises a control circuit for controlling, in three or more stages, a resistance value of said variable resistance element based on the output of said second transistor.

10. The amplifier according to claim 1, wherein the first conducting electrode of said first transistor receives a current from a light receiving element used in a passive optical network.

11. An optical module used in a passive optical network having an optical fiber, said optical module comprising:

a light receiving element optically coupled to said optical fiber;

a first transistor having a first conducting electrode coupled to said light receiving element, a control electrode coupled to said first conducting electrode, and a second conducting electrode coupled to a fixed voltage source;

a second transistor having a first conducting electrode, a second conducting electrode coupled to said fixed voltage source, and a control electrode coupled to the control electrode of said first transistor;

a feedback resistance coupled to the control electrode of said second transistor for feeding back an output of said second transistor to the control electrode of said second transistor;

a variable resistance element for controlling a ratio between a current flowing from the first conducting electrode of said first transistor into the control electrode of said second transistor and said feedback resistance, and a current flowing from the first conducting electrode into the second conducting electrode in said first transistor; and a terminal receiving a control signal used for controlling a resistance value of said variable resistance element.

* * * * *